(12) United States Patent
Zhang et al.

(10) Patent No.: US 6,849,991 B2
(45) Date of Patent: Feb. 1, 2005

(54) QUARTZ RESONATING PIECE, QUARTZ RESONATOR, AND QUARTZ DEVICE

(75) Inventors: Guoqing Zhang, Minowa-machi (JP); Masako Tanaka, Okaya (JP); Eiji Karaki, Ina (JP); Yukihiro Unno, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 53 days.

(21) Appl. No.: 10/391,745

(22) Filed: Mar. 20, 2003

(65) Prior Publication Data

US 2003/0218512 A1 Nov. 27, 2003

(30) Foreign Application Priority Data

Mar. 26, 2002 (JP) .................................... 2002-087121
Feb. 14, 2003 (JP) .................................... 2003-036605

(51) Int. Cl.[7] ............................................. H01L 41/08
(52) U.S. Cl. ................................................. 310/361
(58) Field of Search ............................................. 310/361

(56) References Cited

U.S. PATENT DOCUMENTS 3,072,806 A * 1/1963 Sogn ............................ 310/361
4,178,566 A * 12/1979 Kawashima ................ 331/156
4,419,600 A * 12/1983 Sinha ........................... 310/361

FOREIGN PATENT DOCUMENTS

JP B2-3218537 8/2001
JP A-2003-324332 11/2003

OTHER PUBLICATIONS

P.C.Y. Lee & Y.K. Yong, "Frequency-Temperature Behavior of Thickness Vibrations of Doubly Rotated Quartz Plates Affected by Plate Dimensions and Orientations", *Journal of Applied Physics*, vol. 60, No. 7, Oct. 1, 1986, p. 2340.

* cited by examiner

*Primary Examiner*—Mark Budd
(74) *Attorney, Agent, or Firm*—Oliff & Berridge, PLC

(57) ABSTRACT

The invention provides a stabilized frequency characteristic over a wide temperature range. A quartz resonating piece is provided such that an electrical axis of quartz corresponds to an X axis, a mechanical axis of the quartz corresponds to a Y axis, and an optical axis of the quartz corresponds to a Z axis. The quartz resonating piece includes a quartz plate having a side that is parallel to an X'axis set by clockwise rotation of the X axis around the Z axis by an angle equal to or greater than −5.0° and less than −1.0° or by an angle greater than +1.0° and equal to or less than 15.9°, and another side that is parallel to a Z' axis set by clockwise rotation of the Z axis around the X' axis by an angle in a range from 34.6° to 35.1° inclusive; or a quartz plate having a side that is parallel to the X' axis set by clockwise rotation of the X axis around the Z axis by an angle in a range from −15.9° to −5.0° inclusive, and another side that is parallel to the Z' axis set by clockwise rotation of the Z axis around the X' axis by an angle in a range from 34.2° to 35.3° inclusive.

7 Claims, 10 Drawing Sheets

(1)

(2)

QUARTZ RESONATING PIECE, QUARTZ RESONATOR, AND QUARTZ DEVICE

BACKGROUND OF THE INVENTION

1. Field of Invention

The present invention relates to a resonating piece that utilizes a piezoelectric effect. More particularly, the invention relates to a quartz resonating piece that utilizes a new cut quartz plate, a quartz resonator, and a quartz device.

2. Description of Related Art

Computerization of various devices and development of communication systems have enabled the usage of quartz devices including piezoelectric oscillators in the related art. In particular, quartz crystals can be used as piezoelectric materials in quartz devices because they provide high frequencies and have stable frequency characteristics. Since an AT cut quartz plate (hereinafter "AT cut plate") can be used to provide a quartz resonator having stable frequency characteristics over a wide temperature range, the related art has used it in quartz devices. This AT cut plate has one side that is parallel to an X axis and is obtained by a cutting operation at a cut angle θ set by clockwise rotation of an XZ plane by 35.25 degrees around the X axis (as viewed from the –X direction to the +X direction of the X axis).

Frequency-temperature characteristics of a quartz resonator formed of the AT cut plate is shown in FIG. 11. In FIG. 11, the horizontal axis indicates the temperature (in ° C.), and the vertical axis indicates the frequency shift (in ppm) from the standard frequency at 25° C.

The related art includes the apparatus disclosed in Japanese Patent No. 3,218,537 and P. C. Y. Lee & Y. K. Yong, "Frequency-Temperature Behavior of Thickness Vibrations of Doubly Rotated Quartz Plates Affected by Plate Dimensions and Orientations", Vol. 60, No. 7, United States, Journal of Applied Physics, Oct. 1, 1986, p. 2340.

SUMMARY OF THE INVENTION

As shown in FIG. 11, in an AT cut plate that is used in the related art, the frequency shift from the frequency at a temperature of 25° C. in a frequency-temperature characteristic becomes abruptly large at a temperature near 100 degrees. Therefore, for example, in a temperature range from –25° C. to +120° C., there is no cut angle at which a variation width of the frequency shift stay within 30 ppm. For this reason, when a quartz resonator formed of an AT cut plate is installed in a device that is used in a wide temperature range, such as an automobile part, it becomes difficult to perform a controlling operation with high precision. Therefore, there is a demand for a quartz resonator that oscillates at a stable frequency so that the frequency shift is within ±15 ppm in a wide temperature range, particularly, in the range from –25° C. to +120° C.

In addition, as mentioned above, since, in the related art, the variation width of the frequency shift in the temperature range from –25° C. to +120° C. is greater than 30 ppm, when an oscillator is used in, for example, an automobile part, a temperature-compensating circuit is used to get a more stable frequency oscillator. However, when a temperature-compensating circuit is used, the number of parts and the number of man-hours are increased, thereby increasing costs.

The present invention addresses or overcomes the aforementioned and/or other problems of the related art. The present invention can provide a stable frequency characteristic in a wide temperature range.

The inventors have conducted research and experiments concerning cut angles of quartz, and have found the cut angles at which a relatively stable frequency characteristic is provided in a wide temperature range. The present invention has been achieved based on this and/or other knowledge. According to one aspect of the present invention, there is provided a quartz resonating piece including: a quartz plate having a side that is parallel to an X' axis set by clockwise rotation of an X axis around a Z axis by an angle equal to or greater than –5.0° and less than –1.0° or by an angle greater than +1.0° and equal to or less than 15.9°, and another side that is parallel to a Z' axis set by clockwise rotation of the Z axis around the X' axis by an angle in a range from 34.6° to 35.1° inclusive. An electrical axis of quartz corresponds to the X axis, a mechanical axis of the quartz corresponds to a Y axis, and an optical axis of the quartz corresponds to the Z axis.

The present invention having this structural feature makes it possible to cause the variation width of the frequency shift in a frequency-temperature characteristic to be within 30 ppm in a temperature range of from –25° C. to +120° C., so that a stable frequency characteristic can be provided in a wide temperature range.

In the invention, "clockwise rotation around an axis" refers to clockwise rotation as viewed from the minus side to the plus side of the axis. Therefore, for example, "clockwise rotation around the Z axis" refers to clockwise rotation as seen from the –Z direction to the +Z direction.

The frequency-temperature characteristic of the quartz resonating piece changes due to the size of a blank, such as an X-side ratio of the blank (divided value of the length along the X'-axis by the thickness of the blank). Accordingly, the inventors investigated the relationship between the cut angles and the X-side ratio of the blank, which provides a stable frequency characteristic in a wide temperature range. In one form of the quartz resonating piece, a length along the X'-axis direction of the quartz plate is equal to or greater than 15 times and less than 22 times the thickness of the quartz plate, and the following Formula 1 is satisfied:

$$\phi°=(-1.0222350\times10^2\times\theta^3+1.0670709\times10^4\times\theta^2-3.7128983\times10^5\times\theta+4.3063628\times10^6\pm3)° \quad [\text{Formula 1}]$$

where φ is an angle of rotation around the Z axis, θ is an angle of rotation around the X' axis, and 34.6°≦θ≦35.1°. By this, the frequency characteristic of the quartz resonating piece having an X-side ratio that is equal to or greater than 15 and less than 22 can be stabilized in the wide temperature range from –25° C. to +120° C.

In another form of this aspect, a length in the X' axis direction of the quartz plate is less than 15 times the thickness of the quartz plate, and the following Formula 2 is satisfied:

$$\phi°=(-1.7916667\times10^2\times\theta^3+1.8731250\times10^4\times\theta^2-6.5277908\times10^5\times\theta+7.5832595\times10^6\pm3)° \quad [\text{Formula 2}]$$

where φ is an angle of rotation around the Z axis, θ is an angle of rotation around the X' axis, and 34.6≦θ≦35.1°. By this, the frequency characteristic of the small quartz resonating piece having an X-side ratio that is less than 15 can be stabilized in the wide temperature range from –25° C. to +120° C.

According to another aspect of the present invention, there is provided a quartz resonating piece including: a quartz plate having a side that is parallel to an X' axis set by clockwise rotation of an X axis around a Z axis by an angle in a range from −15.9° to −5.0° inclusive, and another side that is parallel to a Z' axis set by clockwise rotation of the Z axis around the X' axis by an angle in a range from 34.2° to 35.3° inclusive, where an electrical axis of quartz corresponds to the X axis, a mechanical axis of the quartz corresponds to a Y axis, and an optical axis of the quartz corresponds to the Z axis.

The present invention having this structural feature makes it possible to cause the variation width of the frequency shift in a frequency-temperature characteristic to be within 30 ppm in the temperature range from −25° C. to +120° C., so that a stable frequency characteristic can be provided in a wide temperature range.

In one form of this aspect, a length along the X'-axis direction of the quartz plate is less than 80 times the thickness of the quartz plate, and the following Formula 3 is satisfied:

$$\theta° = (-2.91652 \times 10^{-3} + 1.39515 \times 10^{-4} \times \phi + 35.1541 \pm 0.2)° \quad \text{[Formula 3]}$$

where $\phi$ is an angle of rotation around the Z axis, $\theta$ is an angle of rotation around the X' axis, and $-15.9° \leq \phi \leq -5°$. By this, the frequency characteristic of the quartz resonating piece having an X-side ratio equal to or greater than 10 can be stabilized in the wide temperature range from −25° C. to +120° C.

According to still another aspect of the present invention, there is provided a quartz resonator including: any one of the above-described quartz resonating pieces. By this, it is possible to provide a quartz resonator having a stable frequency characteristic in the wide temperature range from −25° C. to +120° C.

According to still another aspect of the present invention, there is provided a quartz device including: the above-described quartz resonator. By this, even for, for example, an automobile part that is used in a wide temperature range, the frequency characteristic can be stabilized without a temperature-compensating circuit, so that the number of parts and the number of man-hours can be reduced, thereby reducing costs.

DETAILED DESCRIPTION OF PREFERRED EMBODIMENTS

A description of exemplary embodiments of a quartz resonating piece, a quartz resonator, and a quartz device of the present invention is provided in detail with reference to the attached drawings.

It is theoretically proven that, when a quartz plate (base plate) that is obtained by a cutting operation at cut angles set by rotation of axes around two of the three crystal axes (electrical axis, mechanical axis, and optical axis), an inflection point of a frequency shift is shifted towards high temperatures (see, for example, U.S. Pat. No. 3,218,537. A cut angle at which a frequency characteristic is stabilized exists in a temperature range from −25° C. to +120° C.

Figure 11:
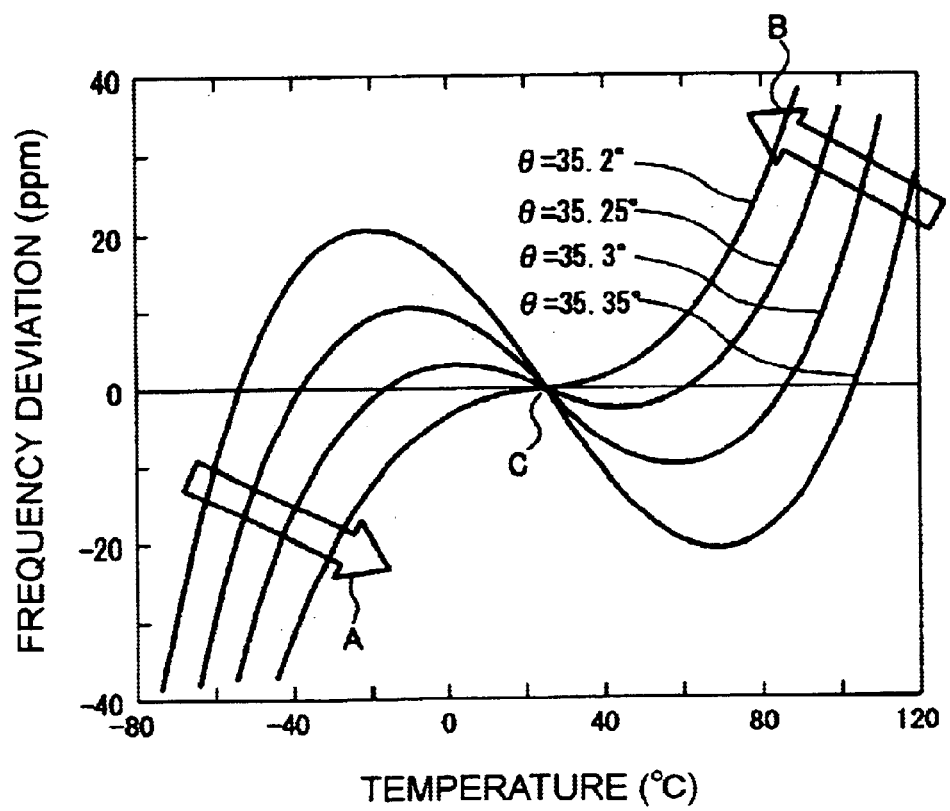
FIG. 11 is a graph showing a frequency-temperature characteristic of a quartz resonator comprising an AT-cut quartz plate.

However, a frequency-temperature characteristic curve changes easily due to the size of a blank. Therefore, the cut-angle area at which the frequency characteristic is stabilized cannot be determined simply by determining the cut angle. For example, in the AT cut quartz resonator having the frequency-temperature characteristic shown in FIG. 11, even if the cut angle is the same, as an X-side ratio of the blank (value resulting from dividing the length in the X' direction of the blank by the thickness of the blank) becomes larger, the frequency-temperature characteristic curve represented as a 3rd function of temperature changes in the direction in which a linear coefficient of the temperature increases, as shown by arrows A and B in FIG. 11. The related art indicates that a quartz plate having coordinate axes in which axes are rotated around two axes shows the same tendency (for example, see the P. C. Y. Lee & Y. K. Yong Article). Therefore, it is necessary to set the cut angle taking into consideration the X-side ratio of the blank.

The temperature characteristic is also affected by the thickness of an electrode formed on the blank. Accordingly, increasing the thickness of the electrode reduces the linear coefficient as it is reduced when the X-side ratio of the blank is reduced. It is also necessary to take into consideration the thickness of the electrode just as it is necessary to take into consideration the cut angle.

Figure 1:
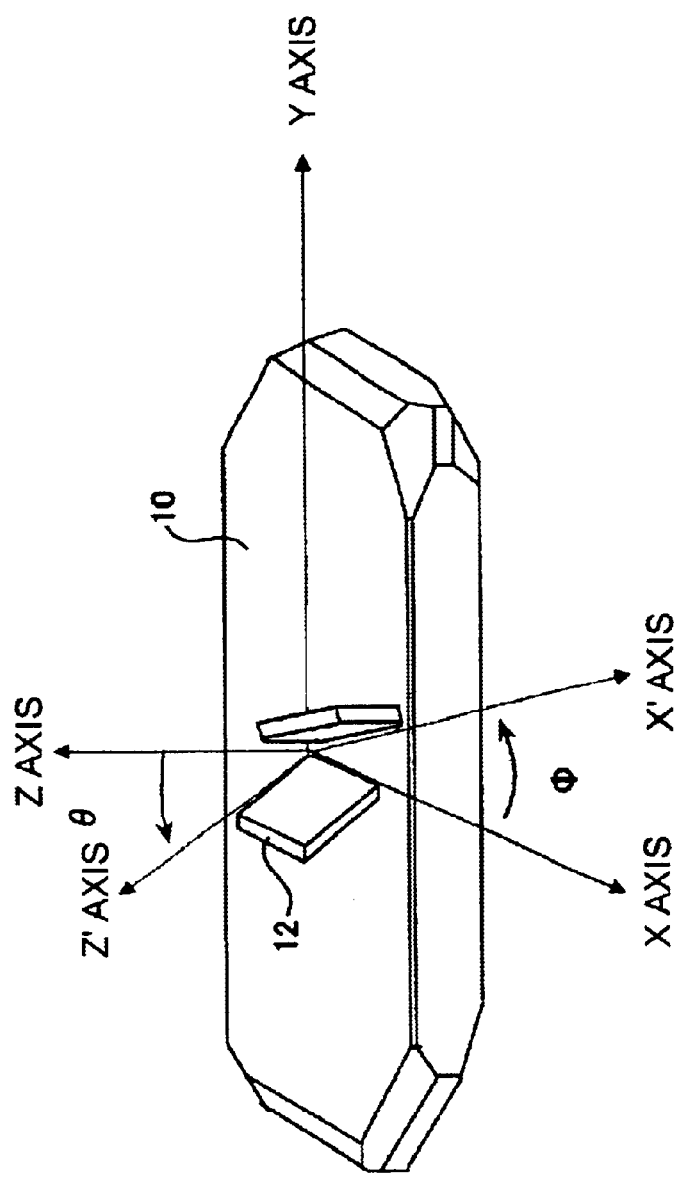
FIG. 1 is a schematic that illustrates cut angles in an exemplary embodiment of the present invention.

FIG. 1 illustrates cut angles of quartz to provide a quartz vibrating piece, which is a quartz resonating piece of the present invention. FIG. 1 shows three axes that are perpendicular to each other of a quartz crystal 10, in which an electrical axis corresponds to an X axis, a mechanical axis corresponds to a Y axis perpendicular to the X axis, and an optical axis corresponds to a Z axis perpendicular to the X and Y axes. A cut angle of a quartz plate (quartz base plate) 12 to provide the quartz vibrating piece of the present invention is formed setting an X' axis by clockwise rotation of the X axis by an angle $\phi$ around the Z axis, so that the quartz plate has a side parallel to the X' axis. The other cut angle is formed by setting a Z' axis by clockwise rotation of the Z axis by an angle $\theta$ around the X' axis, so that the quartz plate 12 has a side parallel to the Z' axis.

The inventors conducted various investigations concerning double-rotation cut angles formed by rotation of axes around the X axis and the Z axis of the crystal quartz 10, and found cut angles at which a relatively stable frequency characteristic was obtained in the temperature range from −25° C. to +120° C.

Figure 2:
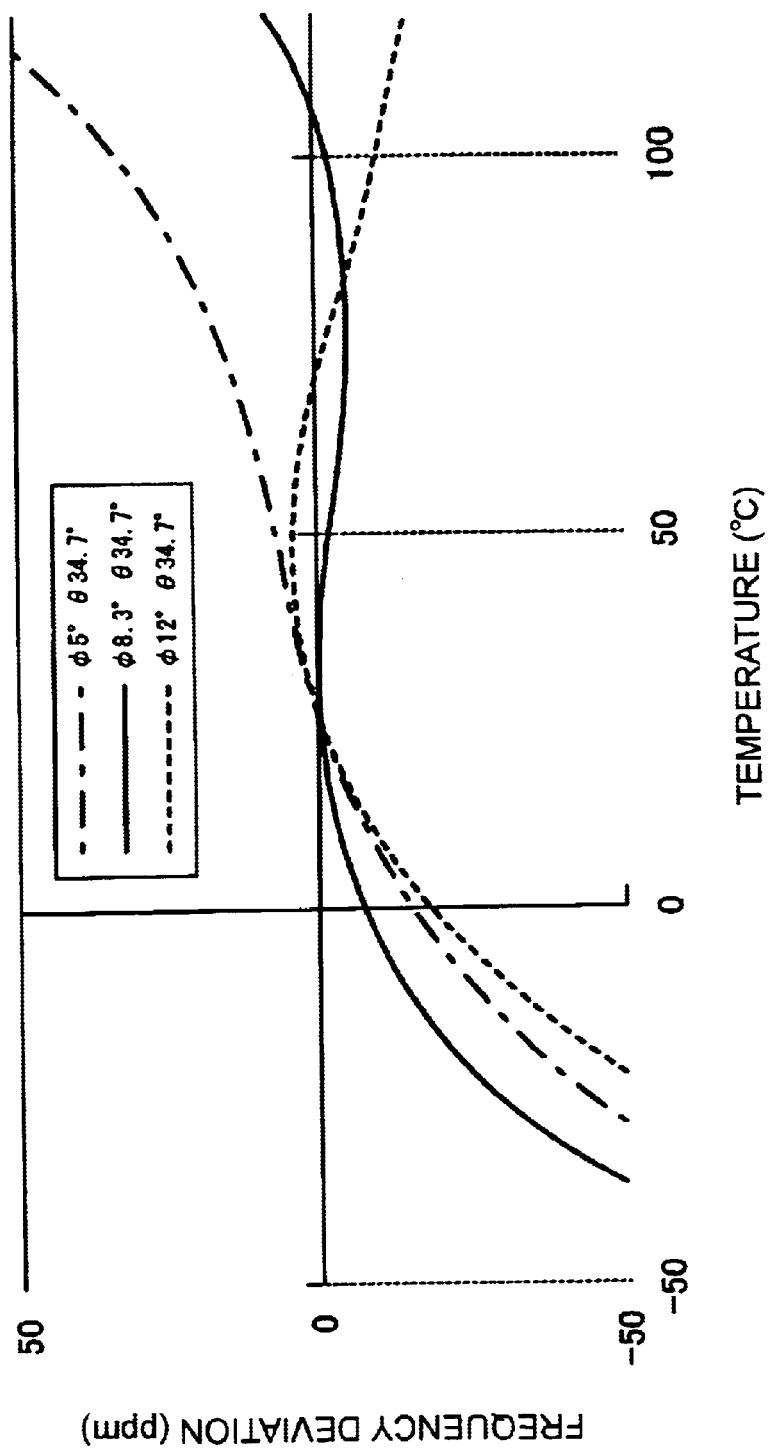
FIG. 2 is a graph showing dependence of a frequency-temperature characteristic of a quartz resonator having an X-side ratio of 10 on a cut angle $\phi$.

FIG. 2 shows measured frequency-temperature characteristic curves for cut angles for a quartz resonator having a principal vibration frequency of 10 MHz and having a rectangular flat shape with an X-side ratio (value resulting from dividing the length in the X' direction of the blank obtained from the quartz plate 12 shown in FIG. 1 by its thickness; this also applies to the X-side ratio in the description below) of 10.0 and a Z-side ratio (value resulting from dividing the length in the Z' direction of the blank obtained from the quartz plate 12 shown in FIG. 1 by its thickness; this also applies to the Z-side ratio in the description below) of 6.2. Here, dependence of f set by clockwise rotation of the Z axis by 34.7 degrees (θ34.7 degrees) around the X' axis was investigated. The plate back amount of the electrode was 2.5%.

In FIG. 2, the horizontal axis indicates the temperature (in ° C.), and the vertical axis indicates the frequency shift (in ppm) from the standard frequency at 25° C. As shown in FIG. 2, when φ=8.3 degrees, a resonator having a variation width of the frequency shift (with the frequency at a temperature of 25° C. set as a standard) within 30 ppm in the temperature range from −25° C. to +120° C. can be provided. Therefore, a quartz device which can be used for a device that is used in a wide temperature range, such as an automobile part, can be provided without a temperature-compensating circuit.

However, when φ is equal to or greater than 16 degrees, the central temperature (corresponding to a point C in FIG. 11, that is, a point intermediate between a low-temperature inflection point and a high-temperature inflection point in each frequency-temperature characteristic curve) becomes equal to or greater than 60 degrees, so that the frequency in a low-temperature area becomes considerably low, thereby making it impossible to set the variation width of the frequency shift within 30 ppm. Similarly, when φ is from −1° to +1° inclusive, since the central temperature is 25° C. as in the AT cut plate, the frequency increases considerably in a high-temperature area Therefore, it is desirable than the range of +be equal to or greater than −5.0° and less than −1°, or greater than +1°and equal to or less than +15.9'. Therefore, it is desirable that the cut angle φ be:

$$-5° \leq \phi < -1°$$ [Formula 4]

or $$1° < \phi \leq 15.9°$$ [Formula 5]

Research conducted by the inventors showed that, by setting φ at a value not deviating from 8.3 degrees by an angle considerably greater than 3 degrees, a resonator having a variation width of the frequency shift within 30 ppm in the temperature range from −25° C. to +120° C. can be reliably provided.

As mentioned above, the frequency-temperature characteristic of a quartz resonator varies depending upon the shape of a blank, in particular, its X-side ratio. Accordingly, the inventors compared optimum cut angles for the frequency-temperature characteristics in the temperature range from −25° C. to +120° C. for a quartz resonator having the aforementioned X-side ratio of 10.0 and Z-side ratio of 6.2 and having a principal vibration frequency of 10 MHz and for a quartz resonator having an X-side ratio of 20 and Z-side ratio of 13 and having a principal vibration frequency of 16 MHz. The results are provided in FIG. 3.

Figure 3:
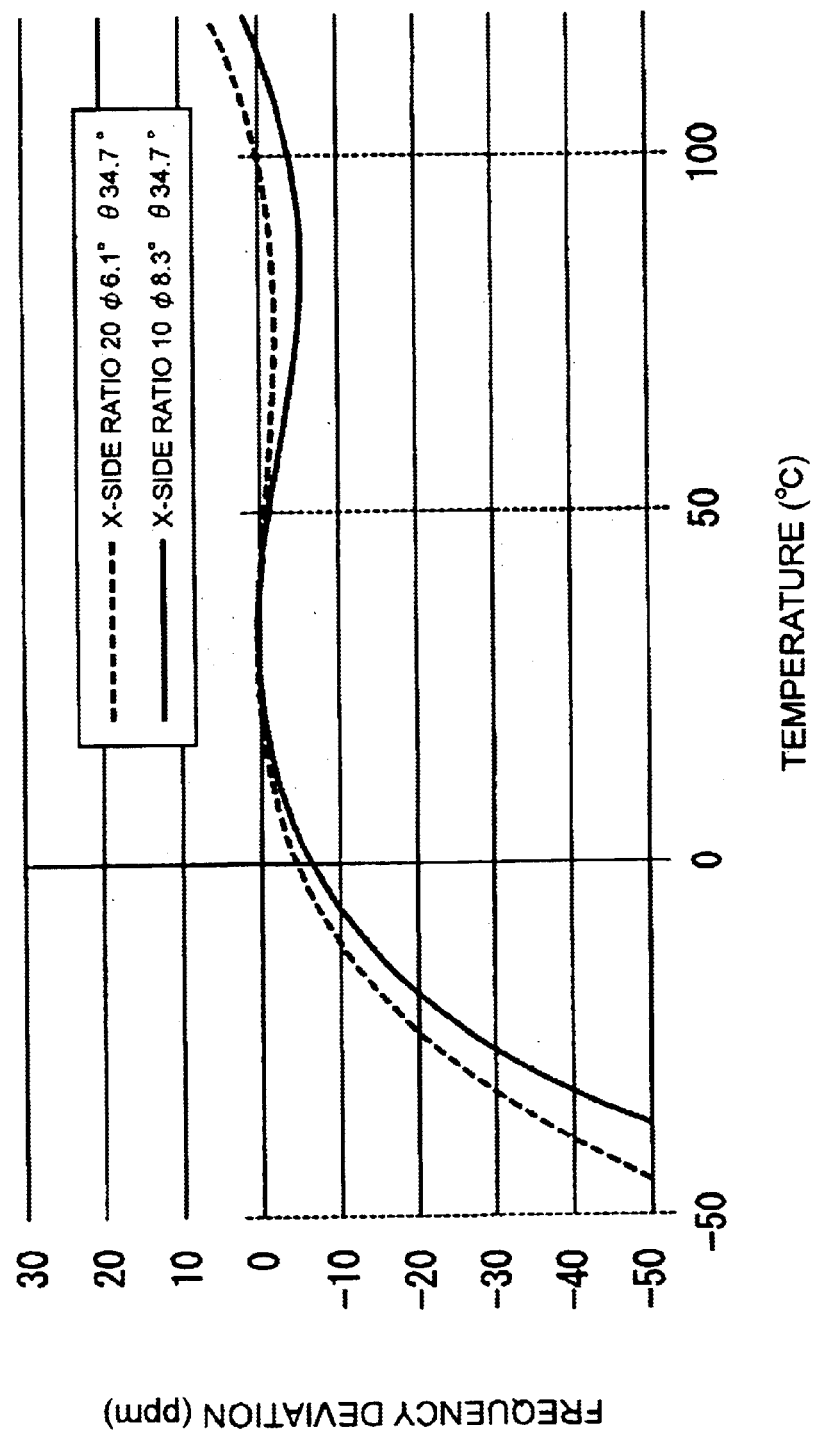
FIG. 3 is a graph showing differences in optimum cut angles due to differences in X-side ratios.

In FIG. 3, the horizontal axis indicates the temperature (in ° C.), and the vertical axis indicates the frequency shift (in ppm) with the frequency at 25° C. serving as a standard. As indicated by the solid line in FIG. 3, for the small resonator having an X-side ratio of 10.0, the cut angles for the optimum frequency-temperature characteristic are φ=8.3° and θ=34.7°. In contrast, for the large resonator having an X-side ratio of 20 indicated by a dotted line in FIG. 3, the optimum frequency-temperature characteristic is obtained when the cut angles are φ6.1° and θ=34.7°.

Accordingly, it is clear that, by a difference between the X-side ratios, the cut angles that provide an optimum or enhanced frequency-temperature characteristic are different. In the temperature range from −25° C. to +120° C., the range of cut angles at which the variation width of the frequency shift stays within 30 ppm may greatly differ depending upon the X-side ratio.

Figure 4:
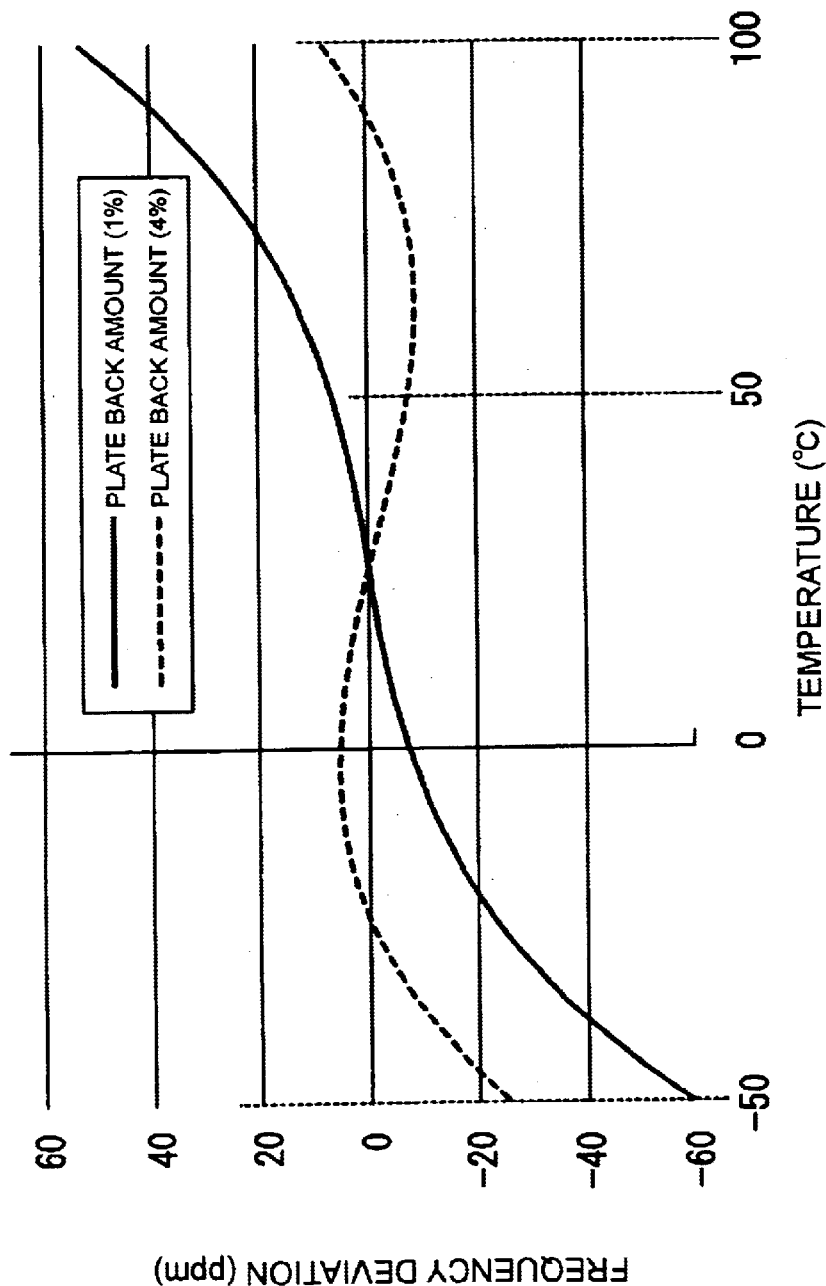
FIG. 4 is a graph showing differences in frequency-temperature characteristics due to differences in electrode film thicknesses (plate back amounts)

FIG. 4 shows a comparison between frequency-temperature characteristics when the film thickness of an electrode (plate back amount) is varied from 1% to 4% for a blank having the same shape with the same cut angles (θ=35° and φ=4.5°). In FIG. 4, the horizontal axis indicates the temperature (in ° C.), and the vertical axis indicates the frequency shift (in ppm) from the standard frequency at 25° C. The solid curve indicates a plate back amount of 1%, and the dotted curve indicates a plate back amount of 4%. As is clear from FIG. 4, it was found that, when the electrode film thickness was changed, the optimal area was also shifted.

The range of cut angles that provide good frequency-temperature characteristics in which the variation width of the frequency shift was within 30 ppm were investigated for the two quartz resonators.

Figure 5:
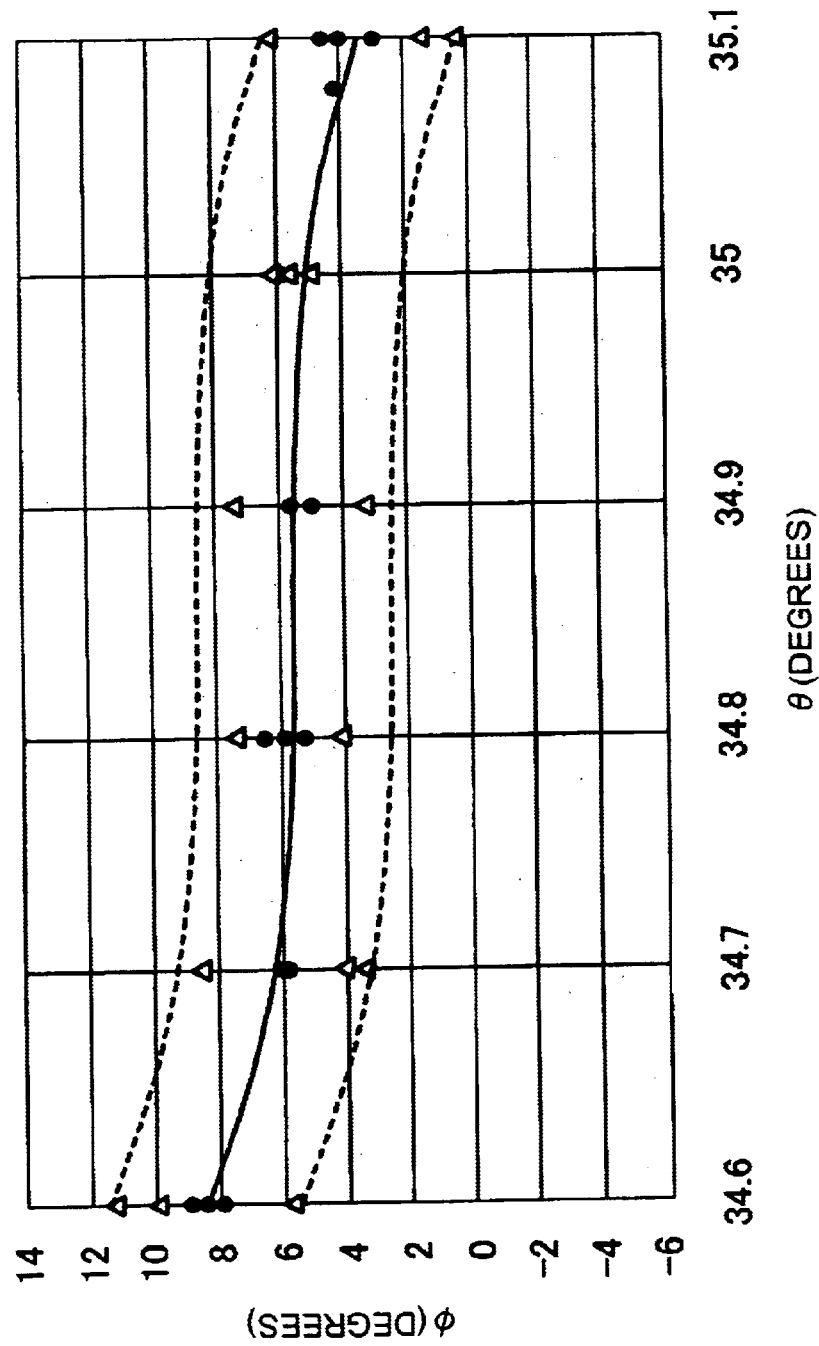
FIG. 5 is a graph showing a range of cut angles that provide a good frequency-temperature characteristic in a quartz resonator having an X-side ratio equal to or greater than 15 and less than 22.

FIG. 5 illustrates cut angles, indicated by black dots, which provide good frequency-temperature characteristics, for a resonator having an X-side ratio of 20, a Z-side ratio of 13, a plate back amount of 2.5%, and a principal vibration frequency of 16 MHz. These pieces of experimental data were found to exist on a functional curve indicated by a solid line. The horizontal axis indicates an angle θ (in degrees) set by clockwise rotation around the X' axis, and the vertical axis indicates an angle φ (in degrees) set by clockwise rotation around the Z axis. However, if the X-side ratio or the electrode film thickness changes, the optimal area changes as mentioned above. Therefore, the optimal area was extensively searched by changing the X-side ratio from 15 to 22, and by changing the plate back amount from 1% to 6%. The results showed that, by changing the conditions, optimal values existed at locations marked by triangles on the graph. In other words, the optimal values existed within an area bounded by dotted lines on both sides of the solid line.

Therefore, when the X-side ratio is equal to or greater than 15 and less than 22, the angle φ in terms of the angle θ that provides a good frequency-temperature characteristic is determined by:

$$\phi° = (-1.0222350 \times 10^2 \times \theta^3 + 1.0670709 \times 10^4 \times \theta^2 - 3.7128983 \times 10^5 \times \theta + 4.3063628 \times 10^6 \pm 3)°$$ [Formula 1]

At this area, when the wideness of an area in which a good frequency-temperature characteristic is obtained for variations in angles is seen, even in the case where there are slight variations in the angle θ, in particular, in an area where θ is equal to or less than 35.1 degrees, if the angle φ is constant, a quartz resonator having a good frequency temperature characteristic can be obtained. Therefore, when mass productivity is considered, it is desirable that θ≦35.1°. However, the temperature characteristic exhibited by such a resonator described above is greatly affected by the X-side ratio and the electrode film thickness. When the X-side ratio and the electrode film thickness are values outside the ranges of values in this embodiment, that is, when the X-side ratio is a value equal to or greater than 22 and/or when the electrode film is thin, that is, when the plate back amount is equal to or less than 1%, there are angles that fall outside the range shown in FIG. 5 or FIG. 6 (described below). Therefore, in order to obtain a stable frequency-temperature characteristic in terms of a wide range of manufacturing conditions, it is necessary for $\phi$ to be equal to or greater than −5.0° and less than −1.0°, or greater than +1° and equal to or less than 15.9°; and for $\theta$ to be from 34.6° to 35.1° inclusive. The condition in which $\phi$ is ±1° is excluded because, under this condition, substantially the same frequency-temperature characteristics as those of the AT cut resonator are only exhibited.

Figure 6:
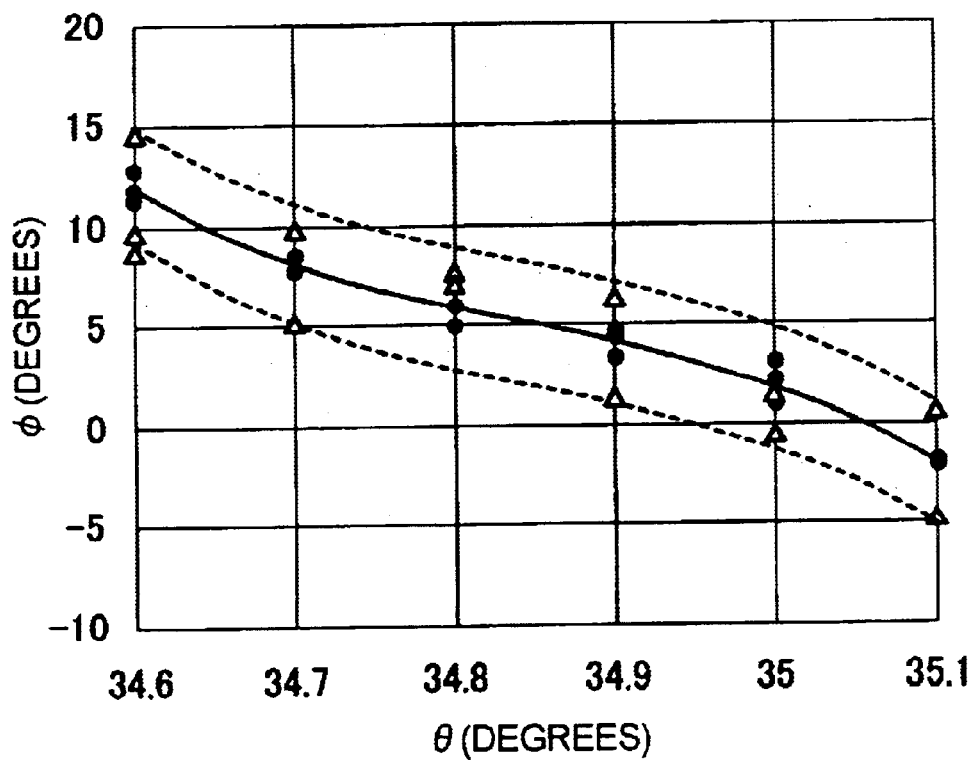
FIG. 6 is a graph showing a range of cut angles that provide a good frequency-temperature characteristic in a quartz resonator having an X-side ratio less than 15.

In FIG. 6, cut angles at which the variation width of the frequency shift was within 30 ppm in the temperature range from −25° C. to +120° C. were determined for a quartz resonator having an X-side width of 10.0, a Z-side width of 6.2, a plate back amount of 2.5%, and a principal vibration frequency of 10 MHz. The cut angles are indicated by black dots. These pieces of experimental data were found to exist on a functional curve indicated by a solid line. Similarly, as previously mentioned, optimal values were extensively searched by changing the X-side ratio from 5 to 15 and by changing the plate back amount from 0.5% to 4%. From the results, it was found that the optimal values existed at locations marked by triangles in FIG. 6. In other words, the optimal values existed within an area bounded by dotted lines on both sides of the solid line.

Therefore, when the X-side ratio is less than 15, the relationship between angle $\theta$ and angle $\phi$ that provides a good frequency-temperature characteristic is determined by:

$$\phi° = (-1.7916667 \times 10^2 \times \theta^3 + 1.8731250 \times 10^4 \times \theta^2 - 6.5277908 \times 10^5 \times \theta + 7.5832595 \times 10^6 \pm 3)° \quad \text{[Formula 2]}$$

However, it is desirable for the angle $\theta$ to be equal to or less than 35.1 degrees as mentioned above. The desirable range of cut angles can be applied to a small quartz resonator having an X-side ratio of less than 15.

Figure 7:
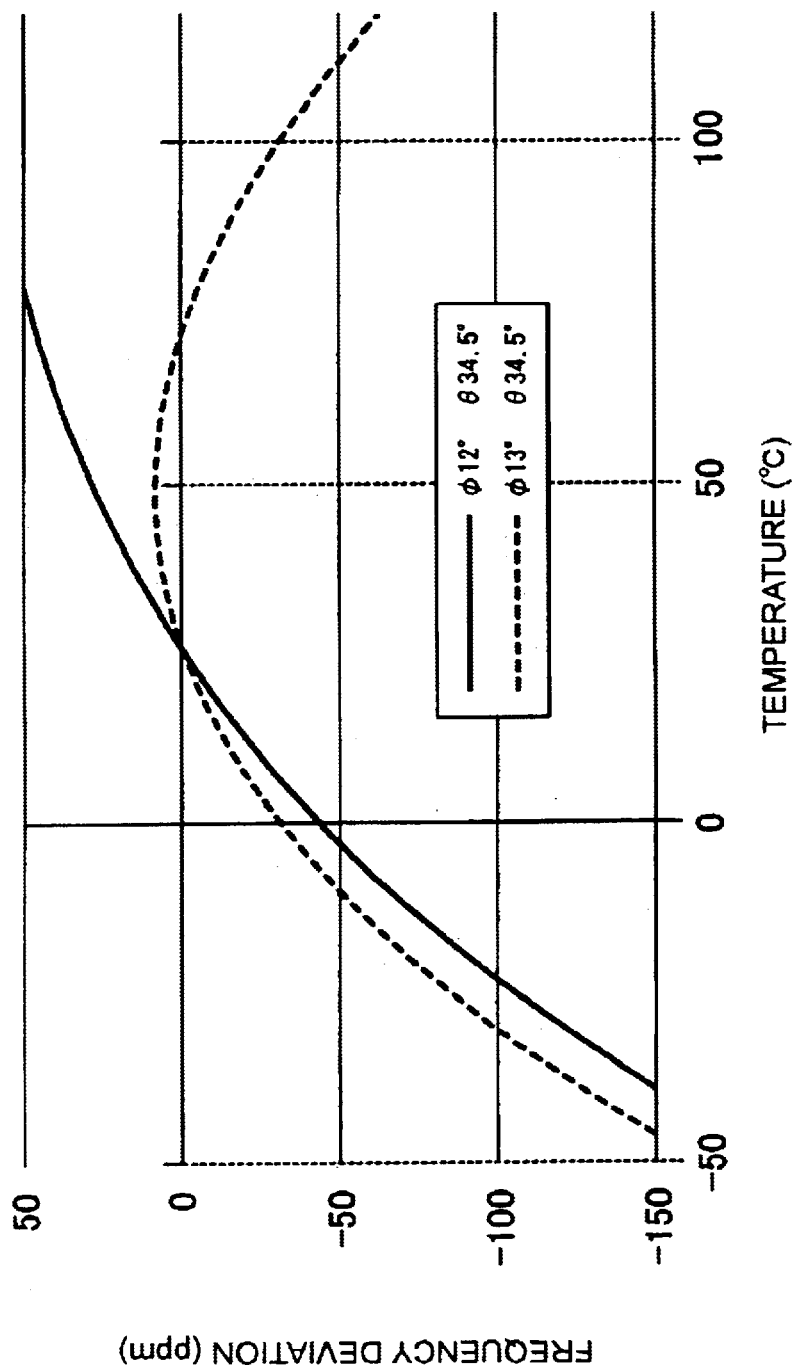
FIG. 7 is a graph showing dependence of a frequency-temperature characteristic on $\phi$ when $\theta$ for a quartz resonator having an X-side ratio of 10 is 34.5°.

FIG. 7 shows a frequency-temperature characteristic at $\theta=34.5°$ for a quartz resonator having an X-side ratio of 10. The horizontal axis indicates the temperature (in ° C.), and the vertical axis indicates the frequency shift (in ppm) with the frequency at 25° C. serving as a standard. In FIG. 7, the solid curve indicates the frequency-temperature characteristic when $\phi=12°$, and the dotted line indicates the temperature-frequency characteristic when $\phi=13$.

As shown in FIG. 7, it was found that, when $\theta=34.5°$ under the condition that the X-side ratio is 10, good frequency-temperature characteristics could not be obtained over the temperature range from −25° C. to +120° C. for any value of $\phi$. This is because the inflection points are too high. Therefore, the $\theta$ area has 34.5 degrees as its lower limit. However, the condition $\theta=34.5$ degrees is not included. In other words, it is desirable that the range of 0 be:

$$34.6° \leq \theta \leq 35.1° \quad \text{[Formula 6]}$$

Figure 8:
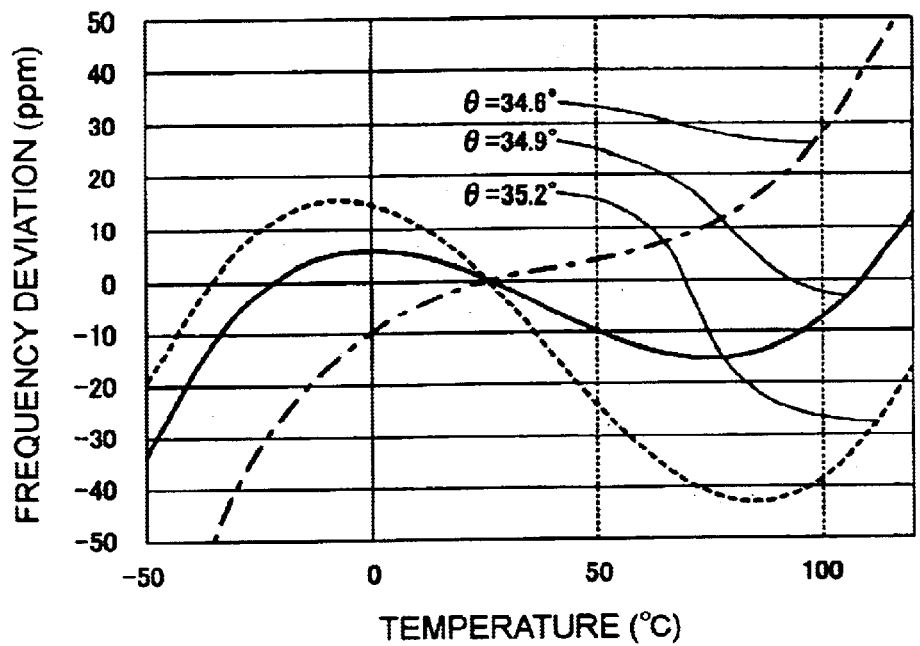
FIG. 8 is a graph showing dependence of a frequency-temperature characteristic on $\theta$ when $\phi$ for a quartz resonator having an X-side ratio of 25.0 is −10.

As described above, in the area where $\phi=-5°$ to 15.9°, a quartz resonating piece having a good temperature characteristic can be provided. Similarly, the inventors conducted experiments for an area in which $\phi$ is equal to or less than −5 degrees on the assumption that a good temperature characteristic existed for this area. In FIG. 8, frequency temperature characteristics in terms of cut angles for a quartz resonator having an X-side ratio of 25.0, a Z-side ratio of 16.5, and a principal vibration frequency of 21 MHz were measured. The dependence of temperature characteristic on 0 was investigated when a rectangular blank formed by rotation in the minus direction (counterclockwise when viewed from the −Z direction to the +Z direction) by 10 degrees with the Z axis as the center was rotated clockwise around the X' axis up to 34.0 degrees to 35.5 degrees ($\theta=34.0°$ to 35.5°). The plate back amount of the electrode was 2.0%.

In FIG. 8, the horizontal axis indicates the temperature (in ° C.), and the vertical axis indicates the frequency shift (in ppm) with the frequency at 25° C. serving as a standard. As shown in FIG. 8, when $\phi=-10'$ and $\theta=34.9°$, a resonator having a variation width of a frequency shift (with the frequency at a temperature of 25° C. serving as a standard) within 30 ppm in the temperature range from −25° C. to +120° C. can be provided. Therefore, a quartz device which can be used for a device that is used in a high temperature range, such as an automobile part, can be provided without using a temperature-compensating circuit. The inventors conducted research and discovered that, in the frequency-temperature characteristic of the quartz resonator shown in FIG. 8, when $\theta$ was deviated from 34.9 degrees by an angle equal to or greater than 0.3 degrees, the temperature linear coefficient became too large as indicated by an alternate long and short dash line where $\phi=10°$ and $\theta=34.6°$, or a characteristic close to that of a quadratic curve as indicated by a dotted line where $\phi=-10°$ and $\theta=35.2°$ was obtained, so that a satisfactory characteristic could not be obtained.

Figure 9:
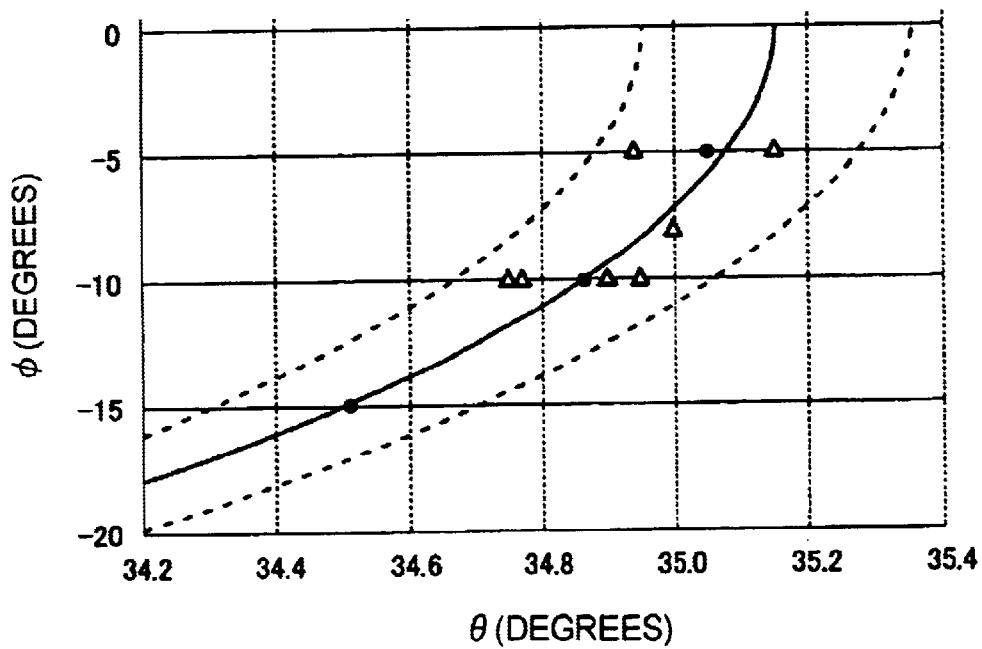
FIG. 9 is a graph showing a range of cut angles that provide a good frequency-temperature characteristic in a quartz resonator having an X-side ratio in a range from 10 to less than 80.

FIG. 9 shows cut angles (indicated by black dots) at which a variation width of a frequency shift is within 30 ppm in the temperature range from −25° C. to +120° C. for a quartz resonator having an X-side ratio of 25.0, a Z-side ratio of 16.5, a plate back amount of 2.0%, and a principal vibration frequency of 20 MHz. These pieces of experimental data were found to exist on a functional curve indicated by a solid line. Similarly, as previously mentioned, optimal values were extensively searched by changing the X-side ratio from 10 to 80. From the results, it was found that the optimal values existed at locations marked by triangles in FIG. 9. In other words, the optimal values existed within an area bounded by dotted lines on both sides of the solid line.

Therefore, for the quartz resonator having an X-side ratio of from 10 to 80, the relationship between $\theta$ $\phi$ that provides a good frequency-temperature characteristic is determined by:

$$\theta° = (-2.91652 \times 10^{-3} \times \phi^2 + 1.39515 \times 10^{-4} \phi + 35.1541 \pm 0.2)° \quad \text{[Formula 3]}$$

At this area, when the wideness of an area in which a good frequency-temperature characteristic is obtained for variations in angles is seen, since the central temperature is equal to or greater than 60° C. when $\phi$ is equal to or less than −16°, the frequency is considerably reduced in a low-temperature area. Therefore, it is desirable that the lower limit of $\phi$ be −16°. However, the condition $\phi=16°$ is not included. In other words, it is desirable that the range of $\phi$ be:

$$-15.9 \leq \phi \leq -5° \quad \text{[Formula 7]}$$

Within the 0 area, satisfactory temperature characteristics could not be obtained for any value of $\phi$ where $\theta=35.4°$. This is because the 2nd order function curves characteristics are exhibited in the temperature area under consideration. When $\theta=34.10°$, good frequency-temperature characteristics could not be obtained for any value of $\phi$ over the temperature range from −25° C. to +120° C. This is because the 1st order coefficient becomes too large. Therefore, it is desirable that the θ area be:

$$34.2° \leq \theta \leq 35.3°$$ [Formula 8]

Figure 10:
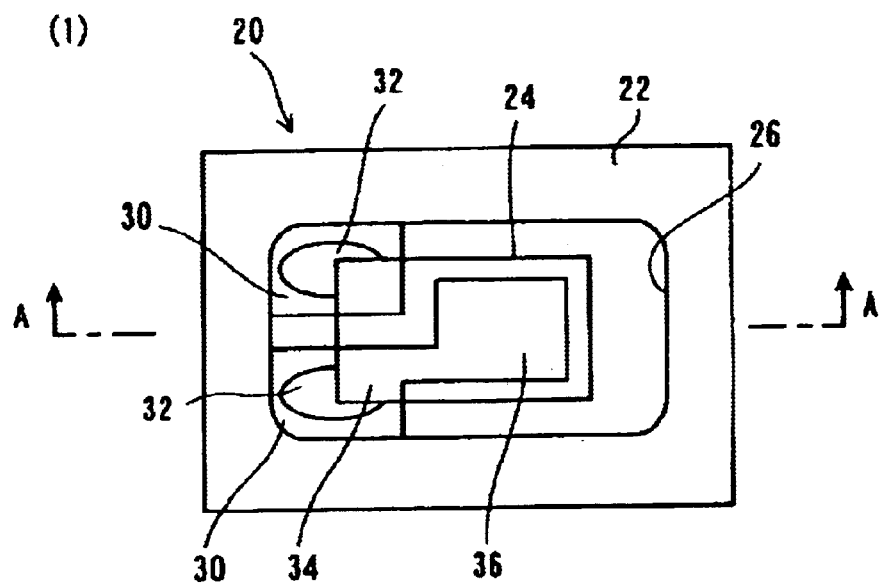
FIGS. 10(1) and 10(2) are schematics that show a quartz resonator of an embodiment of the present invention, where FIG. 10(1) is a sectional view taken along plane B—B of FIG. 10(2), and FIG. 10(2) is a sectional view taken along plane A—A of FIG. 10(1)
Figure 10:
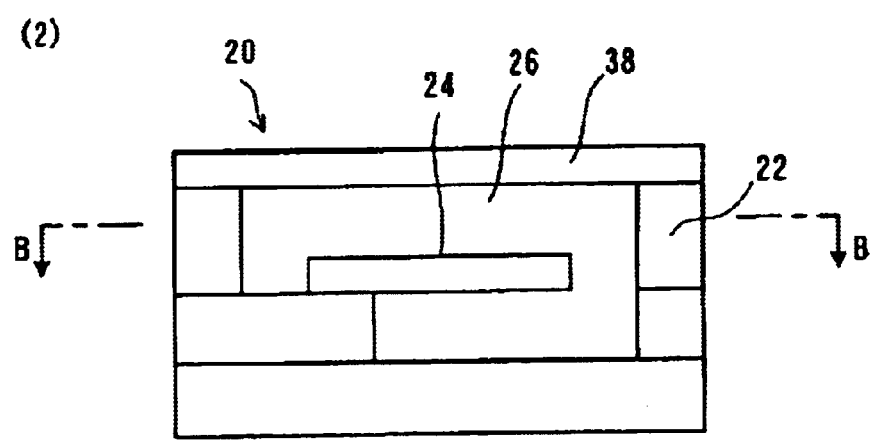

A quartz resonating piece (quartz vibrating piece) formed of the quartz plate 12 provided by a cutting operation at cut angles set by what is called double rotation as described above can be used as a quartz resonator by sealing it in a package. FIGS. 10(1) and 10(2) show a quartz resonator. FIG. 10(1) is a plan sectional view taken along plane B—B of FIG. 10(2), and FIG. 10(2) is a side sectional view taken along plane A—A of FIG. 10-1.

In FIGS. 10(1) and 10(2), in a quartz resonator 20, a package 22 is formed of, for example, a ceramic material. The package 22 has a cavity 26 to accommodate a quartz resonating piece 24. In the package 22, an electrode 30 and a terminal pad (not shown) are disposed on the bottom surface defining the cavity 26, so that they can be brought into electrical conduction with an external terminal (not shown) disposed on the back surface of the package 22. The quartz resonating piece 24 is mounted in a cantilever manner inside the cavity 26. More specifically, electrically conductive adhesive 32 is applied to the electrode 30 and a connecting electrode 34 of the quartz resonating piece 24 is disposed on top of the adhesive 32 and secured to the electrode 30. By this, electrical conduction to an excitation electrode 36 on the quartz resonating piece 24 can be achieved from the external terminal at the bottom surface of the package 22. A cover 38 is sealed to the top portion of the package 22 in order to maintain the atmosphere, such as a nitrogen atmosphere, inside the package 22.

The quartz resonating piece of the exemplary embodiment can be used as a piezoelectric oscillator by combining it with an integrated circuit element and forming an oscillating circuit. For example, by mounting the quartz resonator 20 shown in FIGS. 10(1) and 10(2) and an integrated circuit element (not shown) onto a module substrate having a terminal pad, a piezoelectric oscillator module can be formed. By sealing in the quartz resonating piece 24 and the integrated circuit element inside the package 22 shown in FIGS. 10(1) and 10(2), a piezoelectric oscillator package can be formed.

The quartz resonating piece of the present invention may have a flat shape or a convex shape, or an inverted mesa structure in which the central portion is recessed.

As described above, it is possible to stabilize the frequency characteristic in a wide temperature range by using what is called double-rotation cut angles.

What is claimed is:

1. A quartz resonating piece, comprising:
    a quartz plate having:
        a side that is parallel to an X' axis set by clockwise rotation of an X axis around a Z axis by an angle equal to or greater than −5.0° and less than −1.0° or by an angle greater than +1.0° and equal to or less than 15.9°, and
        another side that is parallel to a Z' axis set by clockwise rotation of the Z axis around the X' axis by an angle in a range from 34.6° to 35.1° inclusive;
    an electrical axis of quartz corresponding to the X axis, a mechanical axis of the quartz corresponding to a Y axis, and an optical axis of the quartz corresponding to the Z axis.

2. The quartz resonating piece according to claim 1,
    a length along the X'-axis direction of the quartz plate being equal to or greater than 15 times and less than 22 times a thickness of the quartz plate, and
    the following condition being satisfied:

$$\phi° = (-1.0222350 \times 10^2 \times \theta^3 + 1.0670709 \times 10^4 \times \theta^2 - 3.7128983 \times 10^5 \times \theta + 4.3063628 \times 10^6 \pm 3)°$$ [Formula 1]

where φ is an angle of rotation around the Z axis, θ is an angle of rotation around the X' axis, and 34.6 ≤ θ ≤ 35.1°.

3. The quartz resonating piece according to claim 1,
    a length along the X'-axis direction of the quartz plate being less than 15 times a thickness of the quartz plate, and:
    the following condition being satisfied:

$$\phi° = (-1.7916667 \times 10^2 \times \theta^3 + 1.8731250 \times 10^4 \times \theta^2 - 6.5277908 \times 10^5 \times \theta + 7.5832595 \times 10^6 \pm 3)°$$ [Formula 2]

where φ is an angle of rotation around the Z axis, θ is an angle of rotation around the X' axis, and 34.6° ≤ θ ≤ 35.10.

4. A quartz resonating piece, comprising:
    a quartz plate having:
        a side that is parallel to an X' axis set by clockwise rotation of an X axis around a Z axis by an angle in a range from −15.9° to −5.0° inclusive, and
        another side that is parallel to a Z' axis set by clockwise rotation of the Z axis around the X' axis by an angle in a range from 34.2° to 35.3° inclusive;
    an electrical axis of quartz corresponding to the X axis, a mechanical axis of the quartz corresponding to a Y axis, and an optical axis of the quartz corresponding to the Z axis.

5. The quartz resonating piece according to claim 4,
    a length along the X'-axis direction of the quartz plate being less than 80 times a thickness of the quartz plate, and
    the following condition being satisfied:

$$\theta° = (-2.91652 \times 10^{-3} \times \phi^2 + 1.39515 \times 10^{-4} \phi + 35.1541 \pm 0.2)°$$ [Formula 3]

where φ is an angle of rotation around the Z axis, θ is an angle of rotation around the X' axis, and −15.9° ≤ φ ≤ −5°.

6. A quartz resonator, comprising:
    the quartz resonating piece according to claim 1.

7. A quartz device, comprising:
    the quartz resonator according to claim 6.

* * * * *